(12) United States Patent
Chiba et al.

(10) Patent No.: US 7,173,466 B2
(45) Date of Patent: Feb. 6, 2007

(54) TIMING SIGNAL GENERATING CIRCUIT HAVING SIMPLE CONFIGURATION WITH LOW SUPPLY VOLTAGE AND GENERATING TIMING SIGNALS WITH HIGH ACCURACY

(75) Inventors: Takaya Chiba, Sapporo (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/347,913

(22) Filed: Jan. 22, 2003

(65) Prior Publication Data
US 2003/0146780 A1    Aug. 7, 2003

(30) Foreign Application Priority Data
Feb. 1, 2002   (JP) .............................. 2002-025724

(51) Int. Cl.
*H03H 11/16* (2006.01)
(52) U.S. Cl. ...................... 327/231; 327/234; 327/247; 327/252; 327/253
(58) Field of Classification Search ................ 327/237, 327/231, 258, 259, 236–239, 246, 247, 250–255, 327/361, 407, 408, 308, 334, 103, 156, 158, 327/234; 375/354, 373, 374–376; 455/130, 455/260
See application file for complete search history.

(56) References Cited

U.S. PATENT DOCUMENTS

| | | | |
|---|---|---|---|
| 4,442,609 A * | 4/1984 | Senoo | 33/356 |
| 4,829,257 A * | 5/1989 | Cooper | 327/237 |
| 6,133,773 A | 10/2000 | Garlepp et al. | 327/247 |
| 6,218,887 B1 * | 4/2001 | Brown | 327/408 |
| 6,403,943 B2 * | 6/2002 | Wada et al. | 250/214 A |
| 6,448,811 B1 * | 9/2002 | Narendra et al. | 326/82 |
| 6,509,773 B2 * | 1/2003 | Buchwald et al. | 327/361 |
| 6,522,175 B2 * | 2/2003 | Ueno et al. | 327/103 |
| 6,617,936 B2 * | 9/2003 | Dally et al. | 331/57 |

FOREIGN PATENT DOCUMENTS

| | | |
|---|---|---|
| EP | 0 884 732 A2 | 12/1998 |
| EP | 1 104 110 A2 | 5/2001 |
| EP | 1 128 559 A1 | 8/2001 |
| JP | 2001-217682 | 1/2001 |

OTHER PUBLICATIONS

Hodges et al., Analysis And Design Of Digital Intergrated Circuits, 1988, McGraw-Hill Inc., 2nd Edition, pp. 408-411.*
Weste et al., Principles of CMOS VLSI Design: A Systems Perspective, 2nd Edition, Addison Wesley Publishing Company, 1993, pp. 71-72.*

* cited by examiner

*Primary Examiner*—Long Nguyen
(74) *Attorney, Agent, or Firm*—Arent Fox PLLC

(57) ABSTRACT

A timing signal generating circuit receives multiphase input signals and generates a signal having a phase intermediate therebetween, and weighting is applied to the multi-phase input signals by using a variable impedance circuit. The timing signal generating circuit (receiver circuit) can operate with a low supply voltage, is simple in configuration, and can generate timing signals with high accuracy.

41 Claims, 15 Drawing Sheets

TIMING SIGNAL GENERATING CIRCUIT HAVING SIMPLE CONFIGURATION WITH LOW SUPPLY VOLTAGE AND GENERATING TIMING SIGNALS WITH HIGH ACCURACY

CROSS REFERENCE TO RELATED APPLICATION

This application is based upon and claims the benefit of priority from the prior Japanese Patent Application No. 2002-025724, filed on Feb. 1, 2002, the entire contents of which are incorporated herein by reference.

BACKGROUND OF THE INVENTION

1. Field of the Invention

The present invention relates to a timing signal generating circuit which performs phase interpolation and a receiver circuit having such a timing signal generating circuit, and more particularly, to a timing signal generating circuit designed to speed up signal transmission between a plurality of LSIs or a plurality of devices or circuit blocks within a single chip, or between a plurality of boards or a plurality of cabinets.

2. Description of the Related Art

Recently, the performance of components used in computers and other information processing apparatuses has been greatly improved. In particular, dramatic improvements have been made, for example, in the performance of processors and semiconductor memory devices such as DRAMs (Dynamic Random Access Memories). The improvements in the performance of semiconductor memory devices, processors, and the like have come to the point where system performance cannot be improved further unless the speed of signal transmission between components or elements is increased.

Specifically, the speed of signal transmission between a main storage device such as a DRAM and a processor (i.e., between LSIs), for example, is becoming a bottleneck impeding a performance improvement for a computer as a whole. Furthermore, the need for the improvement of signal transmission speed is increasing not only for signal transmission between cabinets or boards (printed wiring boards), such as between a server and a main storage device or between servers connected via a network, but also for signal transmission between chips or between devices or circuit blocks within a chip because of increasing integration and increasing size of semiconductor chips, decreasing supply voltage levels (decreasing signal amplitude levels), etc.

To speed up signal transmission between LSIs, it is required that the receiver circuit operates (detects and discriminates data) with accurate timing with respect to an incoming signal. In the prior art, it is known to provide in a signal receiver circuit a clock recovery circuit that uses a feedback loop type clock signal generating circuit (phase adjusting timing signal generating circuit) in order to generate a clock (internal clock) of such accurate timing. Here, the value of a phase adjusting weight for clock recovery is generated using, for example, a phase comparator circuit which compares the phase of an external input clock with that of the internal clock.

The prior art and the related art and their associated problems will be described in detail later with reference to the accompanying drawings.

SUMMARY OF THE INVENTION

An object of the present invention is to provide a timing signal generating circuit that can operate with low supply voltage, is simple in configuration, and can generate timing signals with high accuracy.

According to the present invention, there is provided a timing signal generating circuit which receives multi-phase input signals and generates a signal having a phase intermediate therebetween, wherein weighting is applied to the multi-phase input signals by using a variable impedance circuit.

Further, according to the present invention, there is also provided a receiver circuit comprising a data detection/discrimination circuit for detecting and discriminating data carried in an input signal; a changing point detection/discrimination circuit for detecting and discriminating a changing point appearing in the input signal; a phase comparator circuit for receiving outputs from the data detection/discrimination circuit and the changing point detection/discrimination circuit, and for comparing the phases of the outputs; and a clock signal generating circuit for receiving an output from the phase comparator circuit, and for supplying a first internal clock to the data detection/discrimination circuit and a second internal clock to the changing point detection/discrimination circuit, wherein the clock signal generating circuit is a timing signal generating circuit which receives multi-phase input signals and generates a signal having a phase intermediate therebetween, wherein weighting is applied to the multiphase input signals by using a variable impedance circuit.

The multi-phase input signals may be clocks of three or more phases. The multi-phase input signals may be four-phase clocks. The variable impedance circuit may comprise a plurality of variable impedance units one for each of the multi-phase input signals. Each of the variable impedance units may comprise a plurality of resistive elements and switching elements connected parallel in pairs, and impedance may be controlled by varying the number of switching elements to be turned on.

Each of the variable impedance units may comprise a plurality of resistive elements and switching elements serially connected in pairs, and impedance may be controlled by controlling the number of switching elements to be turned on. Each of the variable impedance units may comprise a transistor having a first, a second, and a control electrode, the each input signal may be received at the first electrode and output at the second electrode, and impedance may be controlled by controlling a voltage applied to the control electrode. Each of the variable impedance units may comprise a transistor having a first, a second, and a control electrode, the each input signal may be received at the control electrode and output at the second electrode, and impedance may be controlled by controlling a voltage applied to the first electrode.

The transistor may be a MOS transistor. The transistor may be a transistor pair consisting of a PMOS transistor and an NMOS transistor connected in parallel. The timing signal generating circuit may further comprise a current-voltage conversion circuit for converting a current control signal into a voltage control signal, and wherein the impedance may be controlled by the current-to-voltage converted control signal.

Each of the variable impedance units may comprise a plurality of variable impedance parts, and wherein the variable impedance parts in the variable impedance units may be arranged to form a plurality of variable impedance groups. Each of the variable impedance groups may apply the same weighting to different combinations of the multi-phase input signals. The variable impedance groups may be equal in number to the multi-phase input signals, and output multi-phase signals of the same number of phases as the multi-phase input signals.

The input signals may be four-phase clocks, and wherein four variable impedance groups may be provided and the variable impedance groups may output four-phase signals that are spaced 90° apart in phase. The input signals may be eight-phase clocks, and wherein eight variable impedance groups may be provided and the variable impedance groups may output eight-phase signals that are spaced 45° apart in phase. The timing signal generating circuit may further comprise buffers which are placed at input and output stages of the timing signal generating circuit. The buffers may be differential buffers.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of timing signal generating circuits and receiver circuits according to the preferred embodiments of the present invention, a timing signal generating circuit and a receiver circuit according to the prior art and the related art and their associated problems will be described with reference to drawings.

Figure 1:
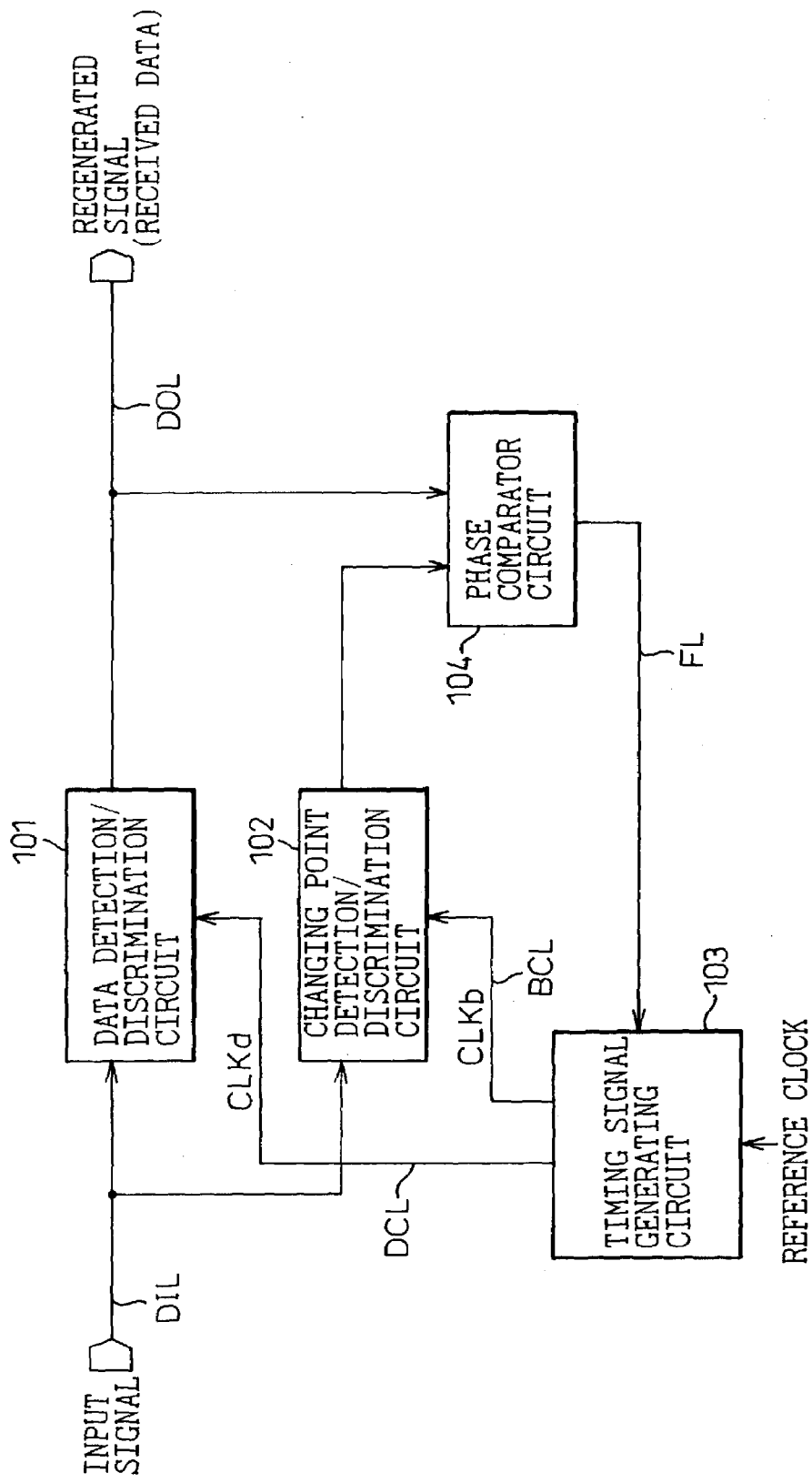
FIG. 1 is a block diagram schematically showing one example of a prior art receiver circuit including a clock recovery circuit.

FIG. 1 is a block diagram schematically showing one example of a prior art receiver circuit including a clock recovery circuit. In FIG. 1, reference numeral 101 is a data detection/discrimination circuit, 102 is a changing point detection/discrimination circuit, 103 is a timing signal generating circuit (a phase adjusting timing signal generating circuit, i.e., a phase interpolator), and 104 is a phase comparator circuit. Further, reference character DIL is a data input line, DOL is a data output line, DCL is a data detection clock line, BCL is a changing point detection clock line, and FL is a feedback line.

As shown in FIG. 1, in the prior art receiver circuit (clock recovery circuit), reference clocks are supplied to the timing signal generating circuit 103 which, by integrating and comparing the weighted sum of the input reference clocks, generates clocks (CLKd and CLKb) of phases corresponding to the values of the weights, and supplies the data detection clock CLKd to the data detection/discrimination circuit 101 and the changing point detection clock CLKb to the changing point detection/discrimination circuit 102.

Here, the data detection clock CLKd is a timing signal used to regenerate (detect) the input signal, and the changing point detection clock CLKb is a timing signal used to detect a changing point in the input signal. The data detection clock CLKd and the changing point detection clock CLKb are chosen to have such a phase relationship that provides a phase difference of about 90° between them for one bit of input signal.

The phase comparator circuit 104 compares the outputs of the data detection/discrimination circuit 101 and the changing point detection/discrimination circuit 102, and supplies (feeds back) a feedback signal (control signal) to the timing signal generating circuit 103 via the feedback line FL.

In the operation of the feedback loop, the data detection/discrimination circuit 101 regenerates (detects) the input signal based on the data detection clock CLKd supplied from the timing signal generating circuit 103, while the changing point detection/discrimination circuit 102 detects the changing point of the input signal based on the changing point detection clock CLKb supplied from the timing signal generating circuit 103.

The phase comparator circuit 104 compares the output of the data detection/discrimination circuit 101 with the output of the changing point detection/discrimination circuit 102, determines whether the timing signals (data detection clock CLKd and changing point detection clock CLKb) are at the proper phases, and supplies the timing signal generating circuit 103 with a phase control signal indicating whether the phase is to be advanced or delayed. The timing signal generating circuit 103 then corrects the phase based on the phase control signal supplied from the phase comparator circuit 104, and supplies the phase-corrected timing signals (CLKd and CLKb) to the respective detection/discrimination circuits (101 and 102).

Figure 5:
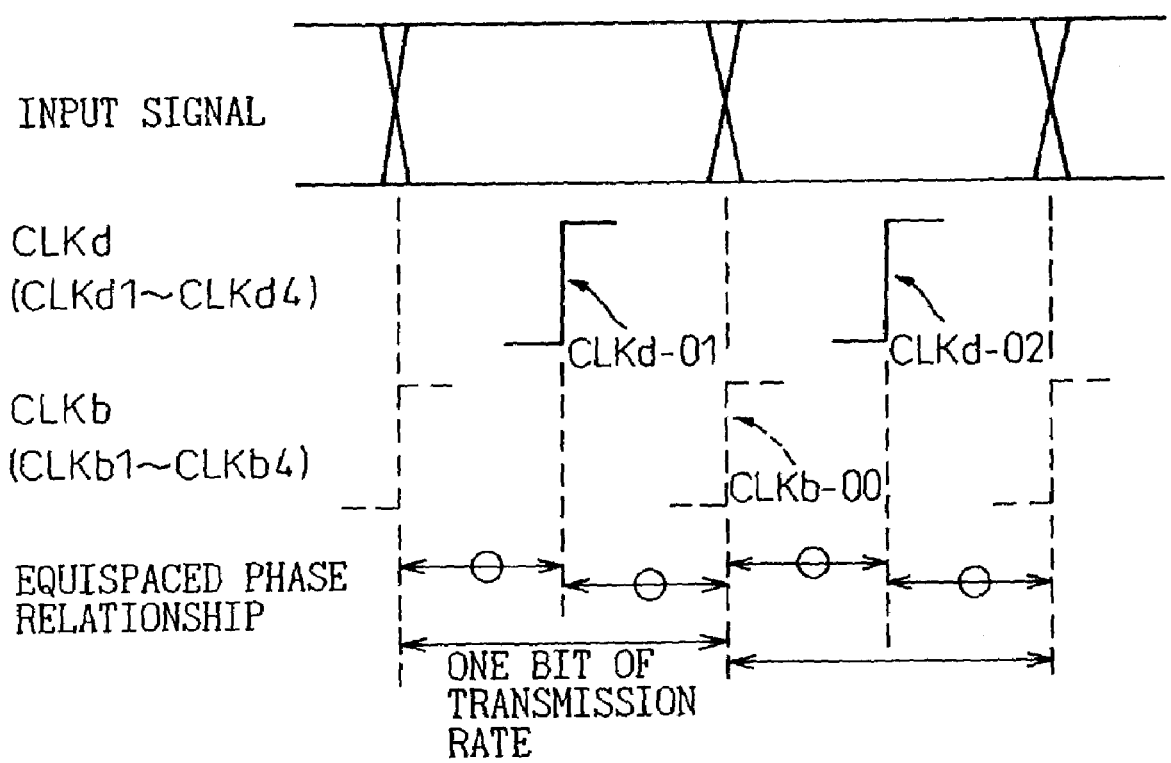
FIG. 5 is a diagram showing signal timings in the receiver circuit.

By repeating the above sequence of operations, the feedback loop causes the changing point detection clock CLKb (CLKb1 to CLKb4) to settle at or near the changing point of the input signal as shown in FIG. 5 to be described later. In this case, since the data detection clock CLKd (CLKd1 to CLKd4) having a phase difference of 90° for one bit of input data occurs at the center of the input signal, the signal can be regenerated with accurate timing.

To achieve the above feedback loop, a timing signal generating circuit capable of generating the timing signals with high accuracy becomes necessary. In the description herein given, the term "clock recovery circuit" is used by focusing attention on the fact that the data detection clock is recovered from the input signal, while the term "receiver circuit" is used by focusing attention on the fact that the data detection/discrimination circuit, using the recovered clock, detects and discriminates the data carried in the input signal, and outputs the data as the received data.

Figure 2:
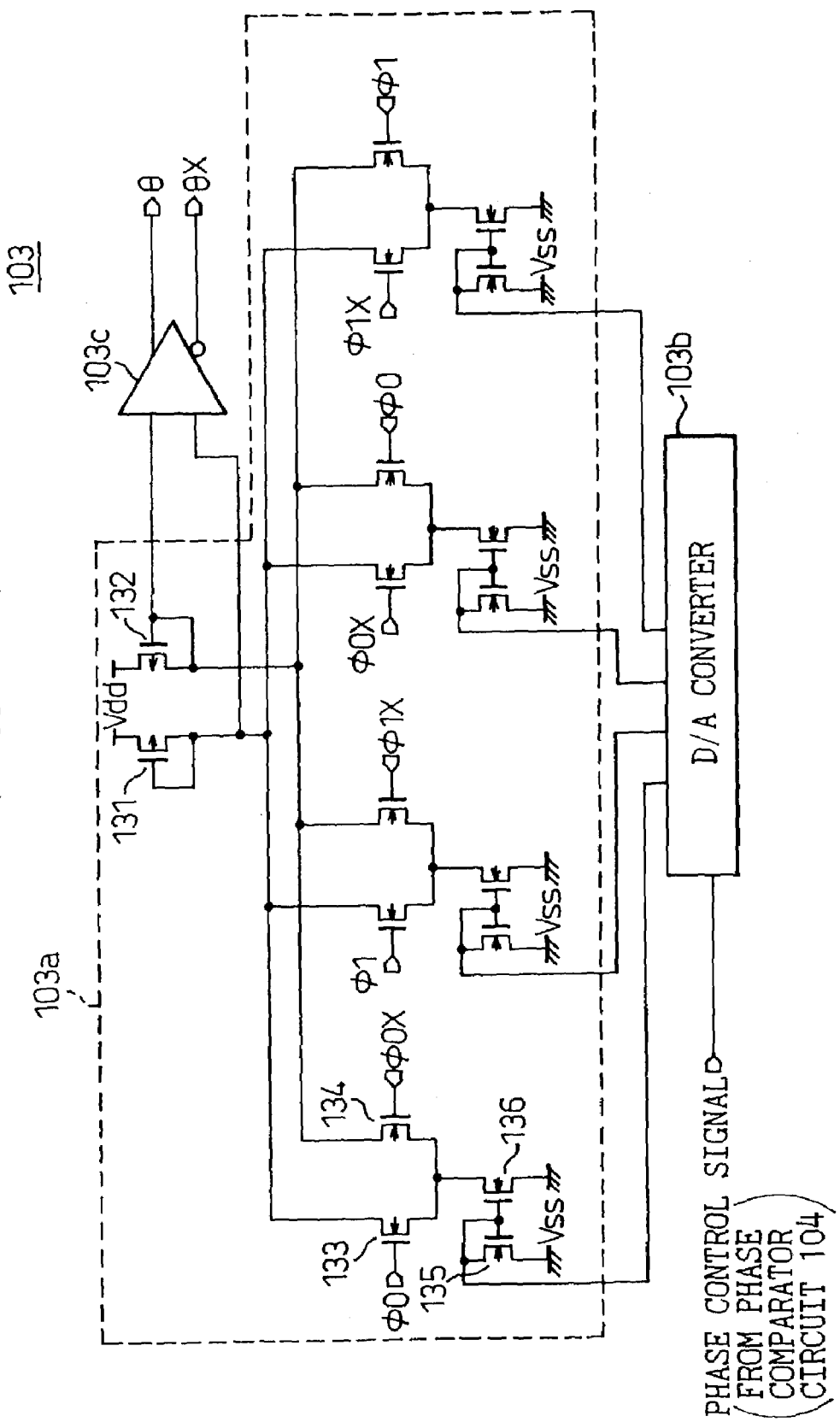
FIG. 2 is a block circuit diagram showing one example of a timing signal generating circuit in the receiver circuit of FIG. 1.
Figure 3:
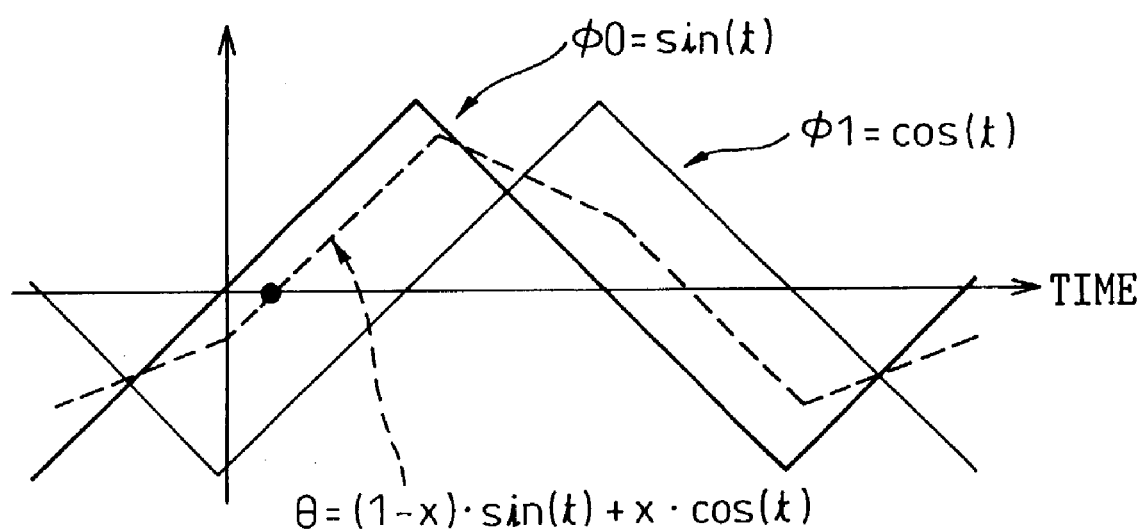
FIG. 3 is a waveform diagram for explaining the operation of the timing signal generating circuit of FIG. 2.

FIG. 2 is a block circuit diagram showing one example of the timing signal generating circuit 103 in the receiver circuit of FIG. 1, and FIG. 3 is a waveform diagram for explaining the operation of the timing signal generating circuit of FIG. 2. In FIG. 2, reference numeral 103a is a phase combining circuit (phase mixer), 103b is a digital-to-analog converter (D/A converter), and 103c is a comparator.

The phase combining circuit 103a receives, for example, four-phase clocks (reference clocks) φ0, φ0X, φ1, and φ1X and the outputs of the D/A converter 104d, applies weights (the outputs of the D/A converter 104d) to the respective clocks, and thereby outputs through the comparator 104c a clock θ (θX) having a phase intermediate between the respective clocks. Here, the four-phase clocks are of the same frequency but differ in phase by 90° relative to each other; that is, the clock φ0 has a phase difference of 180° relative to the clock φ0X, and likewise, the clock φ1 has a phase difference of 180° relative to the clock φ1X.

More specifically, as shown in FIG. 2, the phase combining circuit 103a comprises four differential pairs of transistors 133 and 134, to which the four-phase clocks φ0, φ0X, φ1, and φ1X are input, load transistors 131 and 132 provided common to all the transistor differential pairs, and a current source transistor 136 (135) which is provided for each transistor differential pair, and which applies a weight by varying the bias current value in accordance with the output of the D/A converter 103b. Here, the bias current source transistor 136 for controlling the current flowing to the differential amplifier (differential-input transistor) is connected in a current-mirror configuration to the transistor 135 whose current is controlled by the output of the D/A converter 103b.

The four-phase clocks φ0, φ0X, φ1, and φ1X (two phase reference clocks) are respectively weighted and summed together in the phase combining circuit 103a, and thereafter fed to the comparator 103c to obtain the phase intermediate between the two input clocks. As earlier described, the D/A converter 103b generates a weight signal by receiving from the phase comparator circuit 104 the phase control signal based on which to determine whether the phase is to be advanced or delayed.

FIG. 3 is a waveform diagram for explaining the operation of the timing signal generating circuit of FIG. 2.

As shown in FIG. 3, in the timing signal generating circuit of FIG. 2, if φ0=sin(t) and φ1=cos(t), for example, φ0 is weighted with (1−x) and φ1 with (x), and the combined signal (output clock) θ is then given as θ=(1−x)·sin(t)+x·cos(t).

Figure 4:
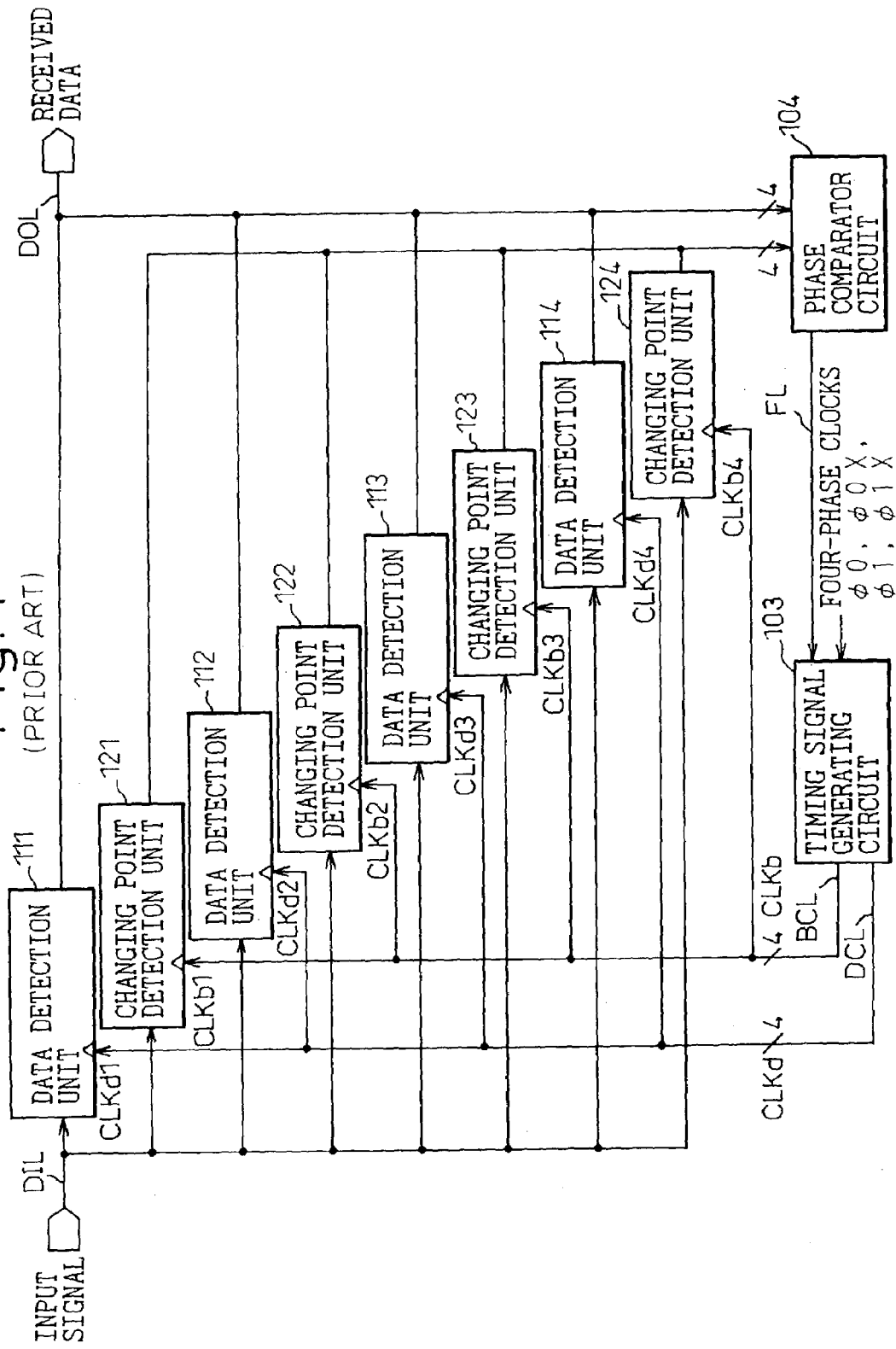
FIG. 4 is a block diagram schematically showing one example of the receiver circuit including the clock recovery circuit.

FIG. 4 is a block diagram schematically showing one example of the receiver circuit including the clock recovery circuit, wherein the circuit is configured as a 4-way×2 type interleaving circuit. In FIG. 4, reference numerals 111 to 114 are data detection units, 121 to 124 are changing point detection units, 103 is a timing signal generating circuit, and 104 is a phase comparator circuit.

As shown in FIG. 4, in the receiver circuit, two pairs of differential clocks (φ0, φ0X; φ1, φ1X) are supplied as four-phase input signals (four-phase clocks) to the timing signal generating circuit 103 which integrates and compares the weighted sum of the input signals and generates clocks (CLKd and CLKb) of phases corresponding to the values of the weights.

The clock CLKd consists of four data detection unit control signals CLKd1, CLKd2, CLKd3, and CLKd4 whose phases are, for example, spaced 90 degrees apart relative to each other, and these control signals are supplied to the respective data detection units (data detection/discrimination circuits) 111 to 114.

On the other hand, the clock CLKb consists of four changing point detection unit control signals CLKb1, CLKb2, CLKb3, and CLKb4 whose phases are, for example, spaced 90 degrees apart relative to each other, and these control signals are supplied to the respective changing point detection units (changing point detection/discrimination circuits) 121 to 124. The data detection unit control signals CLKd1, CLKd2, CLKd3, and CLKd4 have a phase difference of 45 degrees relative to the respective changing point detection unit control signals CLKb1, CLKb2, CLKb3, and CLKb4.

Accordingly, when data is supplied on the data input line DIL at a rate of 2.5 G [bps], for example, the data detection units 111 to 114 and changing point detection units 121 to 124 operate in interlacing fashion with each unit being driven with a 625-MHz clock.

The data detection units 111 to 114 are each driven, for example, with a 625-MHz clock (data detection unit control signal CLKd1, CLKd2, CLKd3, or CLKd4), detect and discriminate the data carried in the input signal supplied on the data input line DIL, and output the data as received data (regenerated data). The outputs of the data detection units 111 to 114 are also supplied to the phase comparator circuit 104.

Likewise, the changing point detection units 121 to 124 are each driven, for example, with a 625-MHz clock (changing point detection unit control signal CLKb1, CLKb2, CLKb3, or CLKb4), detect and discriminate data changing points appearing in the input signal supplied on the data input line DIL, and supply the result to the phase comparator circuit 104.

The phase comparator circuit 104 compares the outputs of the data detection units 111 to 114 and changing point detection units 121 to 124, and supplies (feeds back) a feedback signal to the timing signal generating circuit 103 via the feedback line FL.

FIG. 5 is a diagram showing signal timings in the receiver circuit, and more specifically, the diagram shows the input signal and the phase relationship between the data detection clock CLKd supplied to the data detection/discrimination circuit 101 and the changing point detection clock CLKb supplied to the changing point detection/discrimination circuit 102 in FIG. 1 or the phase relationship between the data detection unit control signals CLKd1 to CLKd4 supplied to the data detection units 111 to 114 and the changing point detection unit control signals CLKb1 to CLKb4 supplied to the changing point detection units 121 to 124 in FIG. 4; as shown here, the phases of the respective clocks or signals are equally spaced apart from each other. More specifically, the data detection clock CLKd (CLKd1 to CLKd4) and the changing point detection clock CLKb (CLKb1 to CLKb4) have an equispaced phase relationship relative to each other with a phase difference of 90° (a phase difference of ½) for one bit of input signal transmission rate. Accordingly, when the changing point detection clock CLKb is at a changing point of the input signal, the data detection clock CLKd is located at the phase center of the input signal.

In FIG. 5, reference character CLKd-01 indicates one rise timing of a particular data detection clock CLKd (for example, the data detection unit control signal CLKd1) supplied to the data detection/discrimination circuit 101 (the data detection unit 111), and CLKd-02 indicates the rise timing immediately succeeding the rise timing CLKd-01 of that particular data detection clock CLKd (the data detection unit control signal CLKd1). Further, reference character CLKb-01 indicates the rise timing of the changing point detection clock CLKb (the changing point detection unit control signal CLKb1) supplied to the changing point detection/discrimination circuit 102 (the changing point detection unit 121), that occurs between the rise timings CLKd-01 and CLKd-02 of the data detection clock CLKd (the data detection unit control signal CLKd1).

The timing signal generating circuit of the prior art shown in FIG. 2 can generate timing signals with high accuracy, but if the circuit is to be operated with an extremely low supply voltage (for example, about 1.0 V), there arises a problem that needs to be solved.

Specifically, the phase combining circuit 103a shown in FIG. 2 becomes a problem when it comes to reducing the supply voltage.

Figure 6:
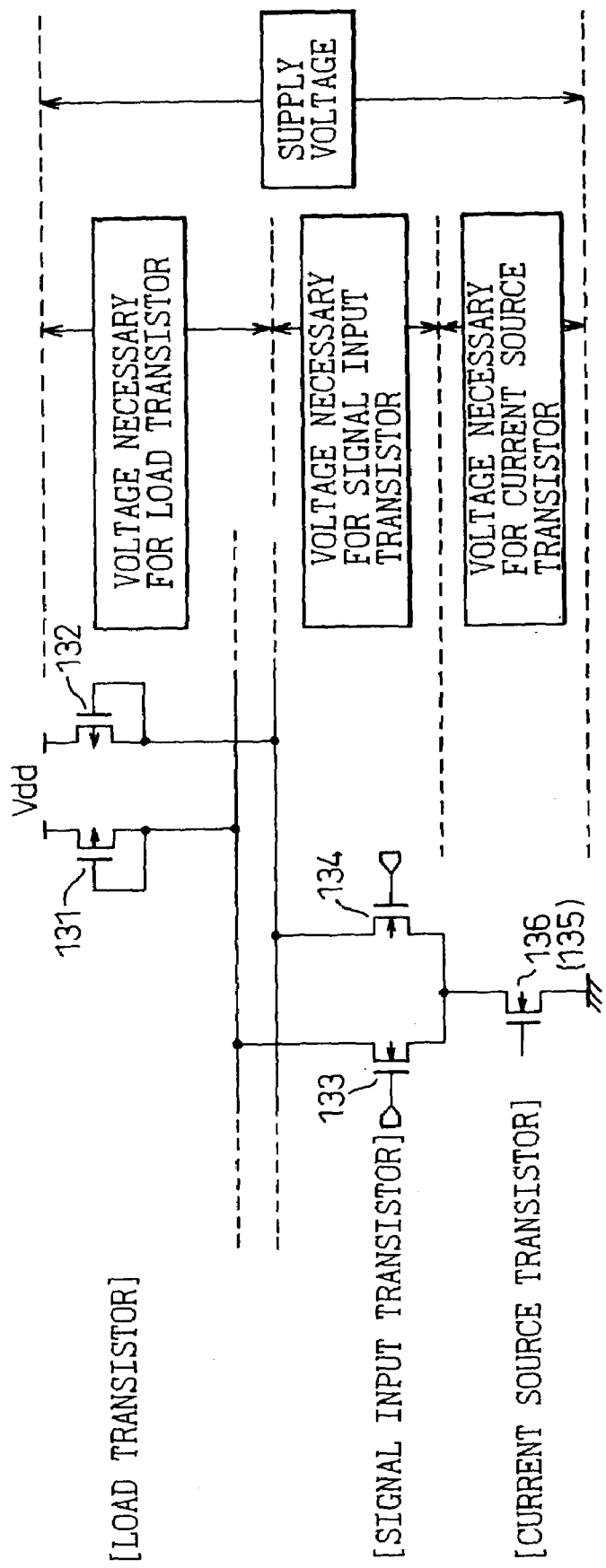
FIG. 6 is a diagram showing particularly an essential portion of a phase combining circuit in the timing signal generating circuit of FIG. 2.

FIG. 6 is a diagram showing particularly an essential portion of the phase combining circuit in the timing signal generating circuit of FIG. 2.

As shown in FIG. 6, the phase combining circuit 103a in the prior art timing signal generating circuit shown in FIG. 2 is configured as a differential amplifier with three transistor stages, i.e., the load transistors 131 and 132, the signal input transistors (differential-input transistors) 133 and 134, and the current source transistor 136 (135), stacked one on top of another. It is therefore necessary to divide the obtained supply voltage and yet secure the voltage necessary for operation of each transistor stage.

Ideally, the current source transistor 136 should be operated in the saturation region of the transistor to minimize variation in the current value, and the source-drain voltage Vds of the transistor must be made sufficiently large (usually, about 0.4 V or larger). The voltage necessary for the load transistors 131 and 132 corresponds to the output amplitude of the phase combining circuit 103a.

The output amplitude of the phase combining circuit must be made as large as possible in order to reduce effects of noise and other disturbances. Therefore, when the supply voltage is 1.0 V, for example, if 0.4 V is secured for the output amplitude, a voltage of only 0.2 V is left for the signal input transistors 133 and 134.

The signal input transistors 133 and 134 are thus driven by the voltage left after subtracting the voltages necessary for the current source transistor 136 and the load transistors 131 and 132 from the supply voltage, but if the Vds of the signal input transistors 133 and 134 is too small, it becomes difficult to secure the necessary gain.

That is, operating the current source transistor in the saturation region and securing a large output amplitude are contradictory requirements. In particular, if the saturation region of the current source transistor is to be increased, the transistor size must be increased, but if the size of the current source transistor is increased, the area occupied by the timing signal generating circuit (phase combining circuit) becomes large, which is not desirable. Further, when sufficient Vds cannot be secured for the signal input transistors, one possible way to secure the necessary gain would be to increase transistor size and thereby increase transistor gm, but if the size of the signal input transistors is made large, not only does the area occupied become large, but the gate capacitance of the signal input transistors also becomes large, making high-speed operation difficult.

Further, when an extremely low supply voltage is used, if that low supply voltage further drops due to supply voltage fluctuation, it may become impossible to secure the necessary voltage for operation of each transistor stage, and in the worst case, the whole circuit may be rendered inoperable.

In this way, when using a low supply voltage, the prior art timing signal generating circuit has involved many design constraints as well as a reliability problem in terms of circuit operation.

It is thus desired to provide a timing signal generating circuit that can generate, with simple circuitry and with high accuracy, a plurality of timing signals having a prescribed phase difference synchronously with a reference clock. Further, with the recent trend toward lower supply voltages for lower power consumption, further miniaturization of the transistor process, etc., it is also desired to provide a timing signal generating circuit that can operate with low supply voltage.

Next, before proceeding to the detailed description of the embodiments of the timing signal generating circuit and receiver circuit according to the present invention, the basic functional configuration of the present invention will be described below.

Figure 7:
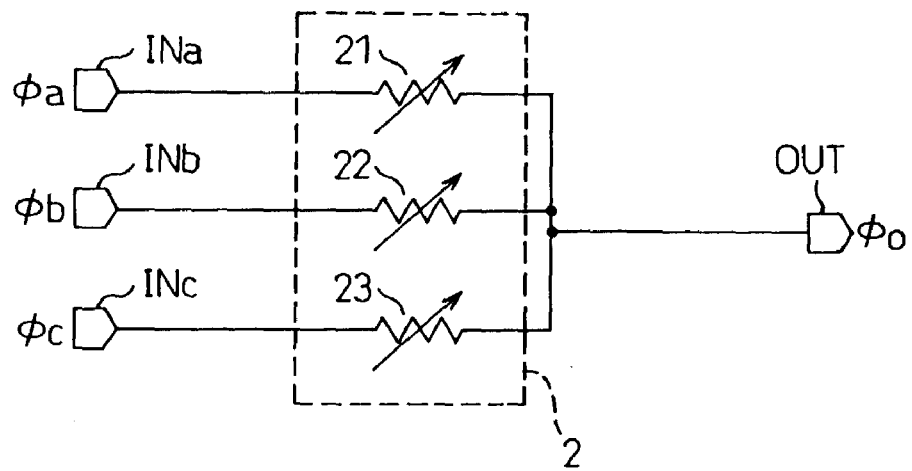
FIG. 7 is a diagram showing the basic functional configuration of a timing signal generating circuit according to the present invention.

FIG. 7 is a diagram showing the basic functional configuration of the timing signal generating circuit according to the present invention. In FIG. 7, reference numeral 2 is a variable impedance circuit; 21, 22, and 23 are variable impedance units; INa, INb, and INc are input terminals; and OUT is an output terminal. Further, reference characters φa, φb, and φc designate reference clocks, for example, three-phase clocks of the same frequency but differing in phase by 120°, while φo indicates an output clock produced by phase combining. In the timing signal generating circuit of the present invention, the reference clocks are not limited to three-phase clocks, but it will be appreciated that a plurality of clocks having a phase difference other than 120° can be used.

As shown in FIG. 7, the timing signal generating circuit according to the present invention comprises the variable impedance circuit 2 having a plurality of variable impedance units (for example, three variable impedance units 21, 22, and 23), and produces an output clock of combined phase by receiving multi-phase reference clocks (for example, three-phase clocks φa, φb, and φc). More specifically, the reference clocks φa, φb, and φc supplied via the respective input terminals INa, INb, and INc are weighted by varying the impedance values of the respective variable impedance units 21, 22, and 23, and the signal combined output (output clock) φo as their sum is obtained at the output terminal OUTPUT through a resistive divider.

According to the present invention, as there is no need to vertically stack transistors as in the prior art timing signal generating circuit described with reference to FIGS. 2 and 6, for example, it becomes possible to construct a timing signal generating circuit that alleviates design constraints for operation on a low supply voltage and can operate at high speed without any problem.

The timing signal generating circuit of the present invention can operate with a low supply voltage, is simple in configuration, and can generate timing signals with high accuracy.

Embodiments of the timing signal generating circuit according to the present invention will now be described in detail below with reference to the accompanying drawings.

Figure 8:
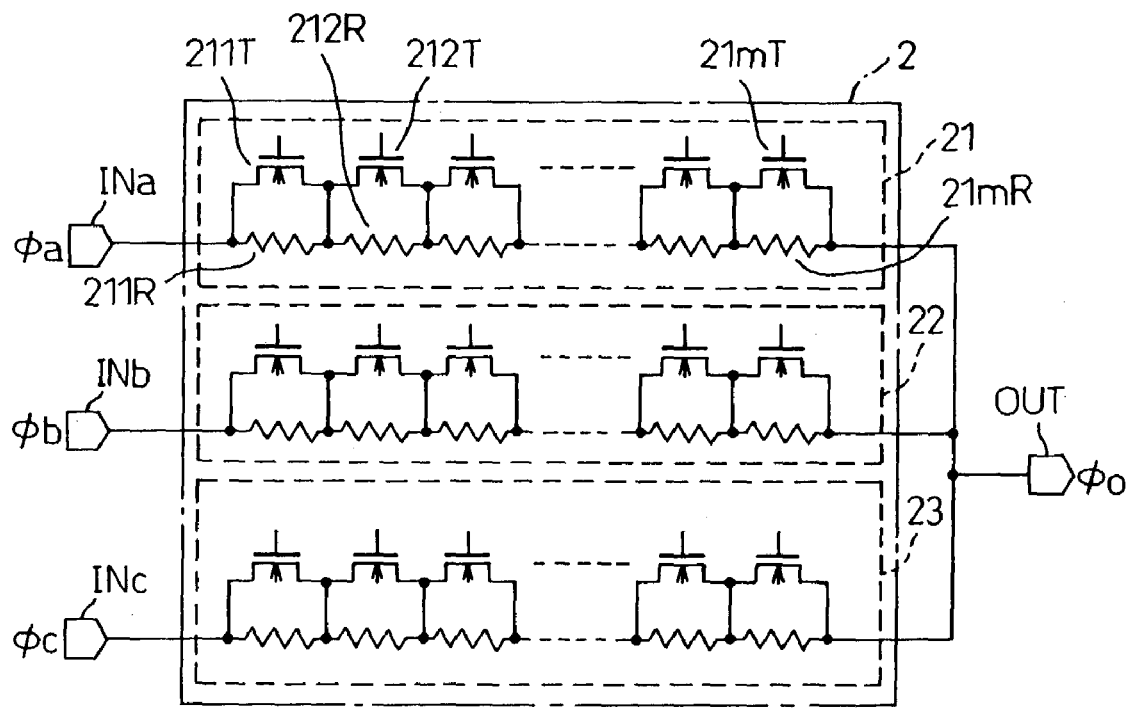
FIG. 8 is a circuit diagram showing a first embodiment of the timing signal generating circuit according to the present invention.

FIG. 8 is a circuit diagram showing a first embodiment of the timing signal generating circuit according to the present invention.

As shown in FIG. 8, the timing signal generating circuit of the first embodiment comprises a variable impedance circuit 2 having three variable impedance units 21, 22, and 23, and produces an output clock of combined phase by receiving three-phase clocks (reference clocks) φa, φb, and φc via respective input terminals INa, INb, and INc.

Each variable impedance unit 21 (22, 23) is constructed from a series connection of m resistor/transistor pairs (211R, 211T; 212R, 212T; . . . ; 21mR, 21mT), each consisting of a resistor (resistive element) and a transistor (switching element, for example, an NMOS transistor) connected in parallel, and the impedance is adjusted by controlling the level of the control signal applied to the gate of each of the transistors 211T to 21mT.

More specifically, in the timing signal generating circuit of the first embodiment, as the number of transistors 211T to 21mT that are turned on increases, the resistance value decreases, and the impedance can thus be adjusted in each variable impedance unit 21 (22, 23). By adjusting the impedances in the respective variable impedance units 21, 22, and 23, the reference clocks φa, φb, and φc supplied via the respective input terminals INa, INb, and INc are weighted and summed together, and an output clock φo of combined phase is taken from the output terminal OUT.

Figure 9:
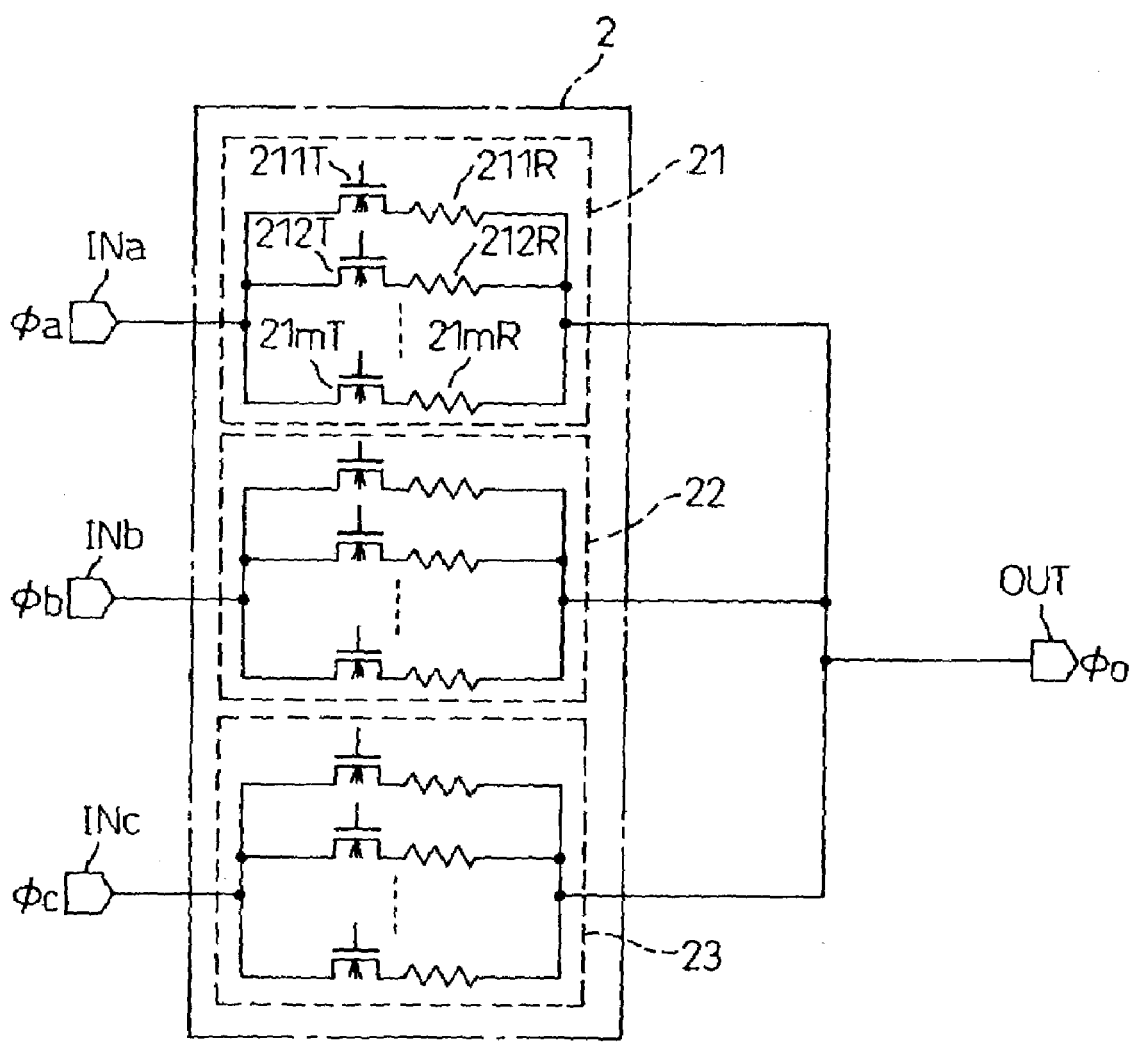
FIG. 9 is a circuit diagram showing a second embodiment of the timing signal generating circuit according to the present invention.

FIG. 9 is a circuit diagram showing a second embodiment of the timing signal generating circuit according to the present invention.

As is apparent from a comparison between FIG. 9 and FIG. 8, in the timing signal generating circuit of the second embodiment, each variable impedance unit 21 (22, 23) is constructed from a parallel connection of m resistor/transistor pairs (211R, 211T; 212R, 212T; . . . ; 21mR, 21mT), each consisting of a resistor (resistive element) and a transistor (switching element) connected in series, and the impedance is adjusted by controlling the level of the control signal applied to the gate of each of the transistors 211T to 21mT.

As can be seen, in the timing signal generating circuit of the foregoing first embodiment, when any one of the transistors 211T to 21mT is turned off, the corresponding one of the resistors 211R to 21mR acts on the impedance of the variable impedance unit 21; on the other hand, in the timing signal generating circuit of the second embodiment, when any one of the transistors 211T to 21mT is turned off, the corresponding one of the resistors 211R to 21mR will not act on the impedance of the variable impedance unit 21.

In the above configuration, the resistive elements and switching elements (transistors) can be easily implemented in LSI form. Further, the first and second embodiments have each been described as having three input terminals (INa, INb, and INc), but it will be appreciated the number of input terminals (the number of reference clocks) can be increased as desired by increasing the number of variable impedance units. That is, the reference clocks are not limited to three-phase clocks, but a plurality of clocks having a phase difference other than that described above can be used (this also applies to other embodiments described hereinafter). Furthermore, the resistors in each variable impedance unit may be chosen to have the same resistance value, or may be chosen to have different values, for example, 1:2:4:8: . . . , or in other suitable ratios.

Figure 10:
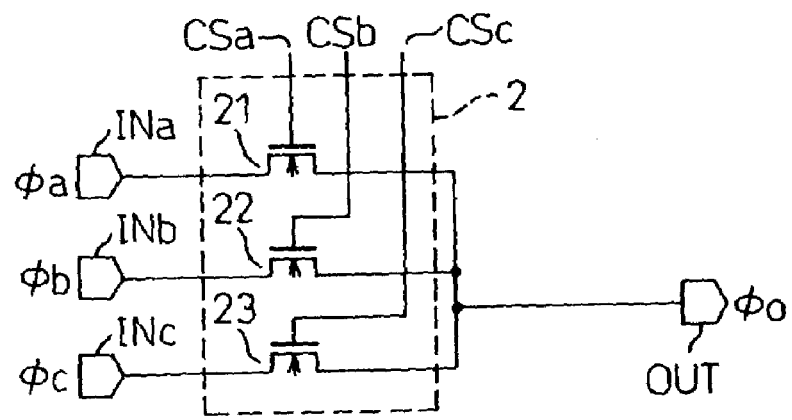
FIG. 10 is a circuit diagram showing a third embodiment of the timing signal generating circuit according to the present invention.

FIG. 10 is a circuit diagram showing a third embodiment of the timing signal generating circuit according to the present invention.

As shown in FIG. 10, in the timing signal generating circuit of the third embodiment, the variable impedance units 21, 22, and 23 are each constructed from a single transistor (NMOS transistor), and control signals CSa, CSb, and CSc are supplied to the gates of the respective transistors 21, 22, and 23.

More specifically, in the timing signal generating circuit of the third embodiment, by controlling the voltage values of the control signals CSa, CSb, and CSc, the gate voltages of the respective transistors 21, 22, and 23 are weighted, thereby varying the ON resistances of the respective transistors to adjust the impedance accordingly.

Figure 11:
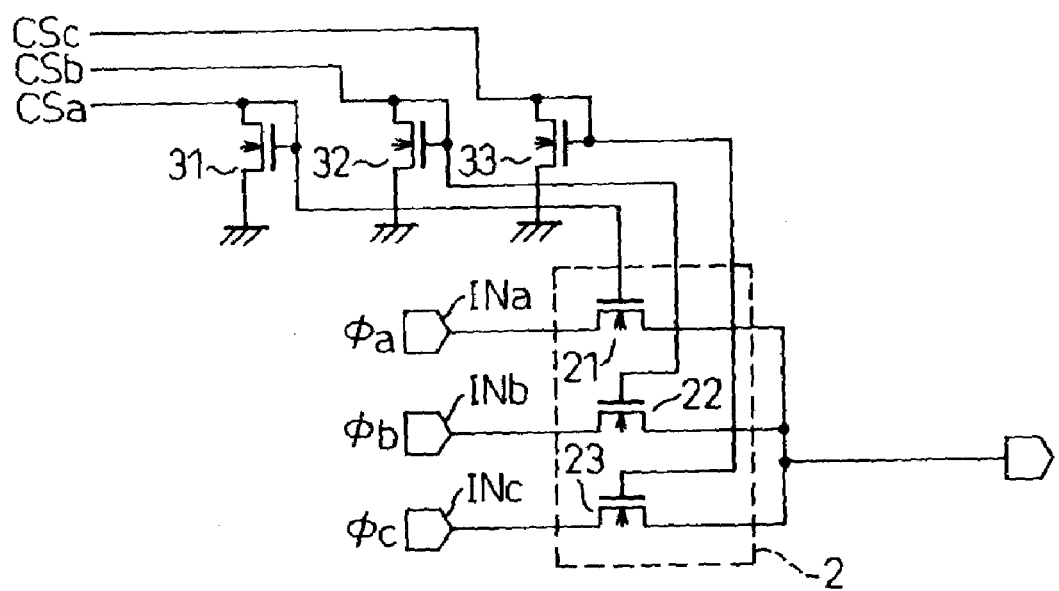
FIG. 11 is a circuit diagram showing a fourth embodiment of the timing signal generating circuit according to the present invention.

FIG. 11 is a circuit diagram showing a fourth embodiment of the timing signal generating circuit according to the present invention.

As is apparent from a comparison between FIG. 11 and FIG. 10, in the timing signal generating circuit of the fourth embodiment, the impedances of the respective transistors (variable impedance units) 21, 22, and 23 are adjusted by controlling the current values of the respective control signals CSa, CSb, and CSc.

More specifically, in the timing signal generating circuit of the fourth embodiment, the current control signals CSa, CSb, and CSc are supplied for current-to-voltage conversion to the gates and drains of NMOS transistors 31, 32, and 33 whose sources are connected to a low voltage supply line, and are supplied to the gates of the respective transistors 21, 22, and 23 for impedance adjustment.

Figure 12:
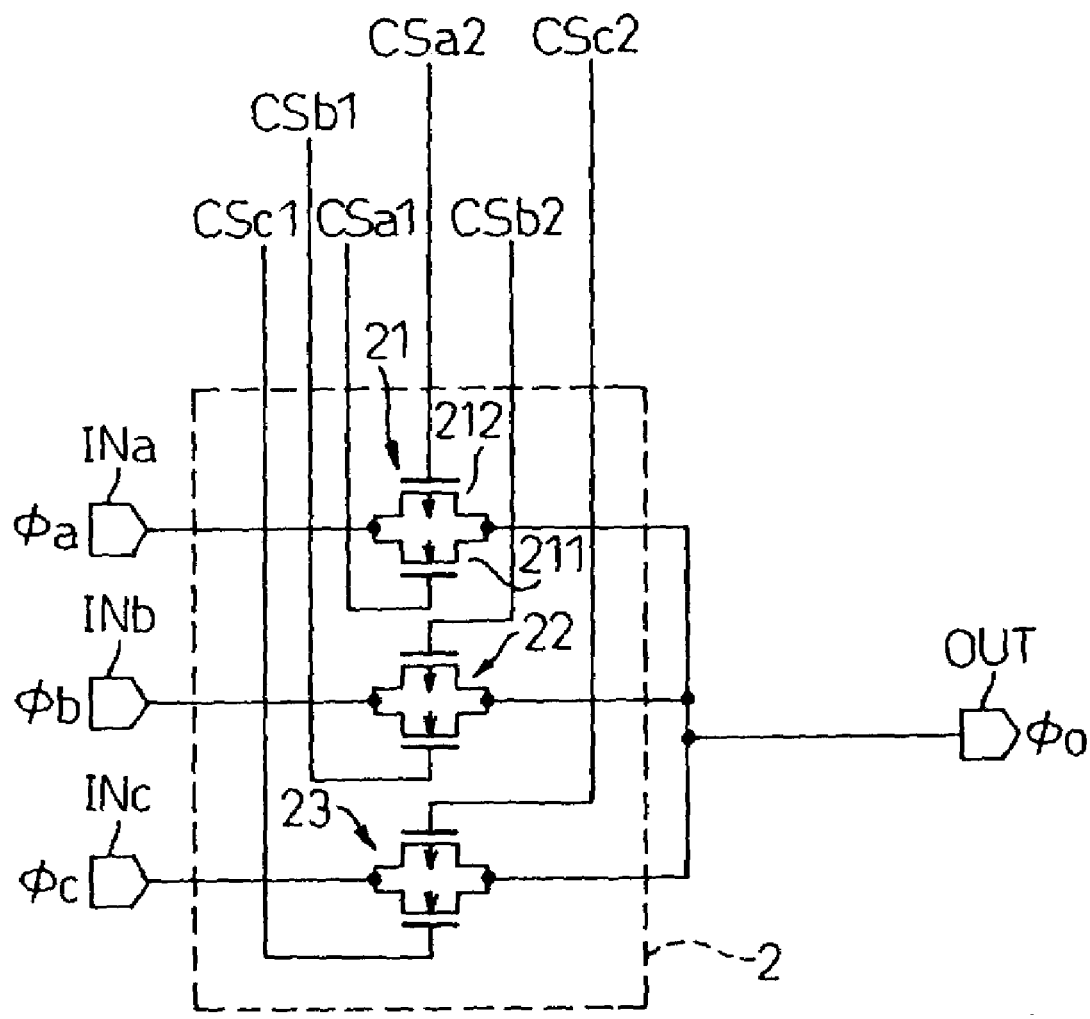
FIG. 12 is a circuit diagram showing a fifth embodiment of the timing signal generating circuit according to the present invention.

FIG. 12 is a circuit diagram showing a fifth embodiment of the timing signal generating circuit according to the present invention.

As is apparent from a comparison between FIG. 12 and FIG. 10, in the timing signal generating circuit of the fifth embodiment, each variable impedance unit 21 (22, 23) is constructed from two transistors, i.e., an NMOS transistor 211 and a PMOS transistor 212, not from an NMOS transistor (21) alone as in the third embodiment shown in FIG. 10.

That is, if the variable impedance unit is constructed from a single NMOS transistor (21) as in the third (or fourth) embodiment described above, it operates only in a low voltage region; accordingly, in the timing signal generating circuit of the fifth embodiment, the variable impedance unit 21 is constructed from the NMOS transistor 211 and PMOS transistor 212 connected in parallel, to increase the operating voltage region.

In other words, if the variable impedance unit is constructed from the NMOS transistor (21) alone, a situation can occur where the drain/source voltage of the NMOS transistor exceeds the gate voltage, limiting the output amplitude. By contrast, when the variable impedance unit is constructed from the NMOS transistor 211 and PMOS transistor 212 connected in parallel, as in the timing signal generating circuit of the fifth embodiment, the output amplitude will not be limited because, in a voltage region where one transistor (for example, the NMOS transistor 211) cannot operate, the other transistor (for example, the PMOS transistor 212) can operate.

The control signals used in the timing signal generating circuit of the fifth embodiment consist of control signals CSa1, CSb1, and CSc1, which are supplied to the gates of the NMOS transistors 211 in the respective variable impedance units 21 (22, 23), and control signals CSa2, CSb2, and CSc2, which are supplied to the gates of the PMOS transistors 212 in the respective variable impedance units 21 (22, 23).

Figure 13:
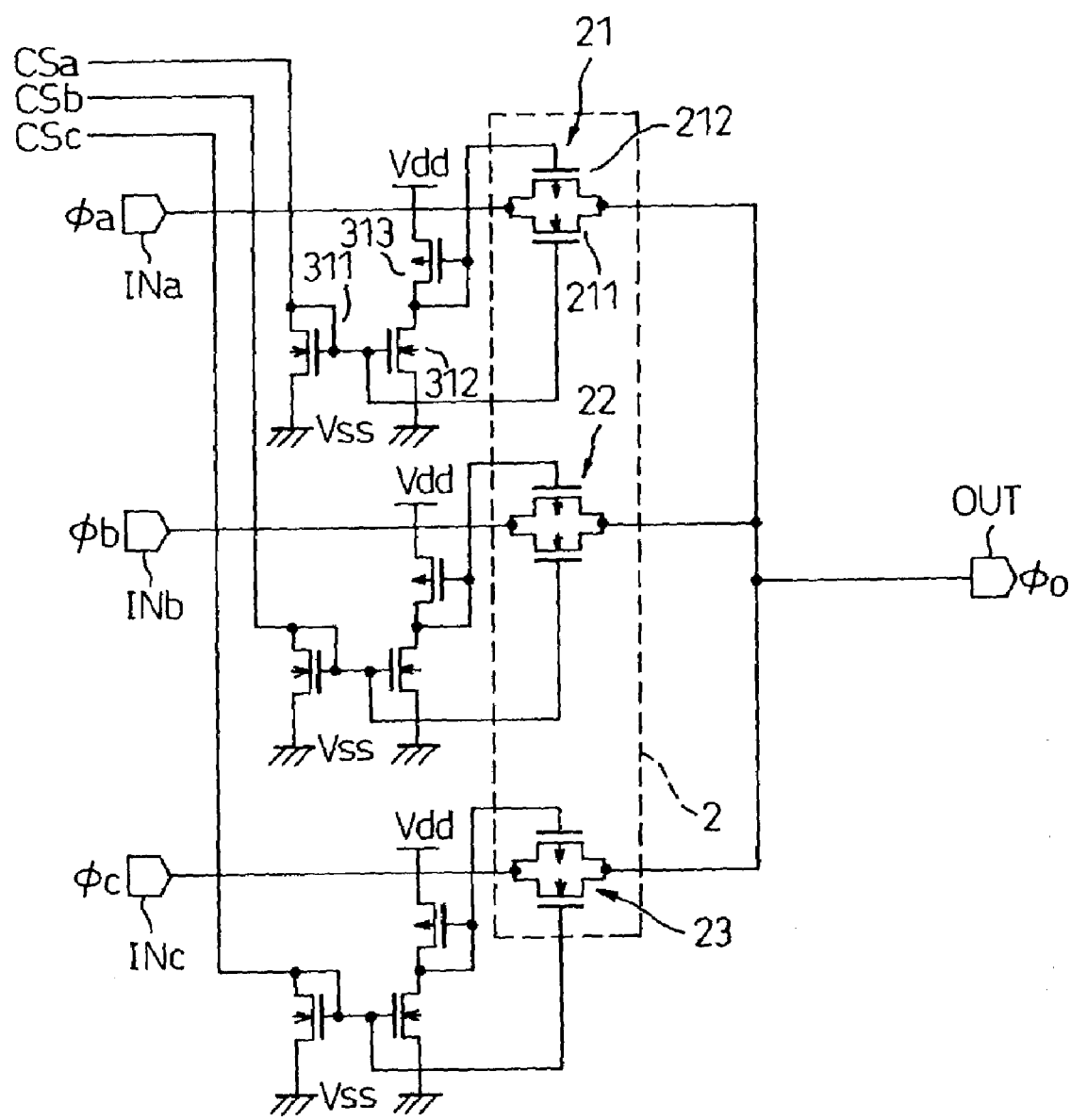
FIG. 13 is a circuit diagram showing a sixth embodiment of the timing signal generating circuit according to the present invention.

FIG. 13 is a circuit diagram showing a sixth embodiment of the timing signal generating circuit according to the present invention.

As is apparent from a comparison between FIG. 13 and FIG. 12, in the timing signal generating circuit of the sixth embodiment, the signals (corresponding to the control signals CSa1, CSb1, CSc1, and CSa2, CSb2, CSc2) to be supplied to the gates of the NMOS transistors 211 and PMOS transistors 212 in the respective variable impedance units are generated from the respective current control signals CSa, CSb, and CSc for the respective variable impedance units 21, 22, and 23.

More specifically, the control signal (current control signal) CSa for the variable impedance unit 21 (22, 23) is converted to a voltage by an NMOS transistor 311 and supplied to the gate of the NMOS transistor 211 in the variable impedance unit 21 in a manner similarly to the fourth embodiment shown in FIG. 11; at the same time, the current control signal CSa flows to a PMOS transistor 313 through an NMOS transistor 312 connected in a current-mirror configuration to the NMOS transistor 311, and the control signal converted to a voltage by the PMOS transistor 313 is supplied to the gate of the PMOS transistor 212 in the variable impedance unit 21.

Figure 14:
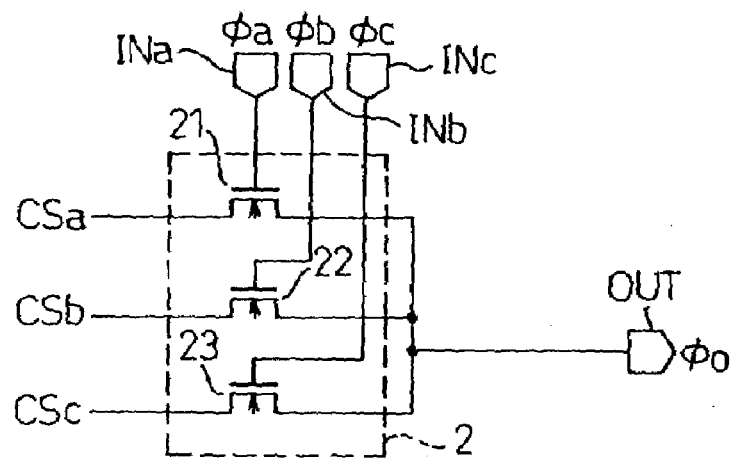
FIG. 14 is a circuit diagram showing a seventh embodiment of the timing signal generating circuit according to the present invention.

FIG. 14 is a circuit diagram showing a seventh embodiment of the timing signal generating circuit according to the present invention.

As shown in FIG. 14, the variable impedance circuit 2 comprises three variable impedance units 21, 22, and 23 each constructed from an NMOS transistor. In the timing signal generating circuit of the seventh embodiment, three-phase clocks (reference clocks) φa, φb, and φc are supplied to the gates of the respective NMOS transistors (variable impedance units) 21, 22, and 23 via the respective input terminals INa, INb, and INc, while control signals CSa, CSb, and CSc are supplied to the drains of the respective NMOS transistors 21, 22, and 23. Then, in the timing signal generating circuit of the seventh embodiment, the reference clocks (φa, φb, and φc) supplied to the gates of the respective NMOS transistors (21, 22, and 23) are weighted by controlling the corresponding drain voltages (control signals CSa, CSb, and CSc) (to adjust the impedance by varying the ON resistance of each transistor) and summed together, and an output clock φo of combined phase is taken from the output terminal OUT.

Figure 15:
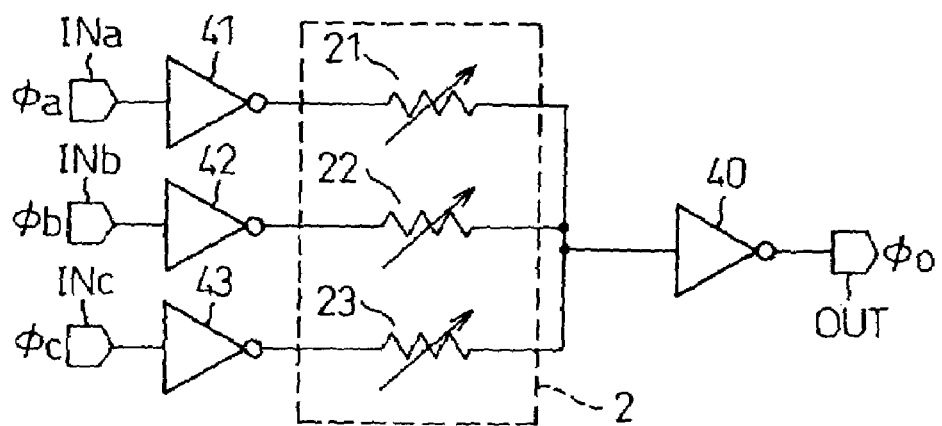
FIG. 15 is a circuit diagram showing an eighth embodiment of the timing signal generating circuit according to the present invention.

FIG. 15 is a circuit diagram showing an eighth embodiment of the timing signal generating circuit according to the present invention.

As shown in FIG. 15, in the timing signal generating circuit of the eighth embodiment, buffers (in this embodiment, inverters) are provided at the input and output stages of each of the variable impedance units 21, 22, and 23 in the variable impedance circuit 2. For example, in the timing signal generating circuit previously shown in FIG. 7, the variable impedance units 21, 22, and 23 each have a low input impedance and a high output impedance; therefore, in the example shown here, inverters 41, 42, and 43 are provided at the input stage, and an inverter 40 is provided at the output stage (common output stage).

Figure 16:
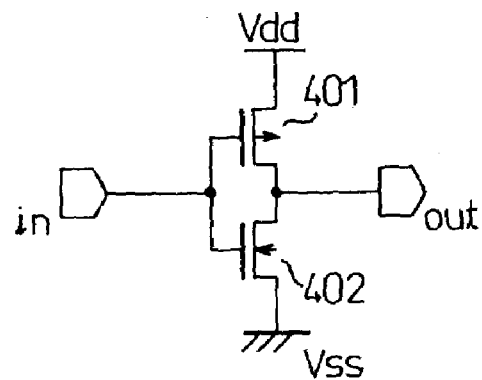
FIG. 16 is a diagram showing the configuration of an inverter in the timing signal generating circuit of FIG. 15.

FIG. 16 is a diagram showing the configuration of the inverter 40 (41, 42, 43) in the timing signal generating circuit of FIG. 15.

The inverter 40 (41, 42, 43) in the timing signal generating circuit of FIG. 15 can be constructed, for example, from a CMOS inverter circuit of simple configuration comprising a PMOS transistor 401 and an NMOS transistor 402. This CMOS inverter circuit does not present any problem for operation with a low supply voltage because, in operation, either one of the transistors, the PMOS transistor 401 or the NMOS transistor 402, is turned on while the other is turned off.

Note, in particular, the inverter (output buffer) 40 provided at the output stage; in the prior art timing signal generating circuit previously shown in FIG. 2, for example, as the output amplitude of the phase combining circuit 103a is limited due to circuit configuration constraints, the signal has had to be regenerated using the comparator 103c having a large gain. On the other hand, in each embodiment of the present invention, since the constraints limiting the output amplitude are reduced because of its design principles, a maximum output amplitude as large as the amplitude of the supply voltage can be obtained; as a result, the output buffer is not required to have a large gain, and the construction can therefore be made simple.

Figure 17:
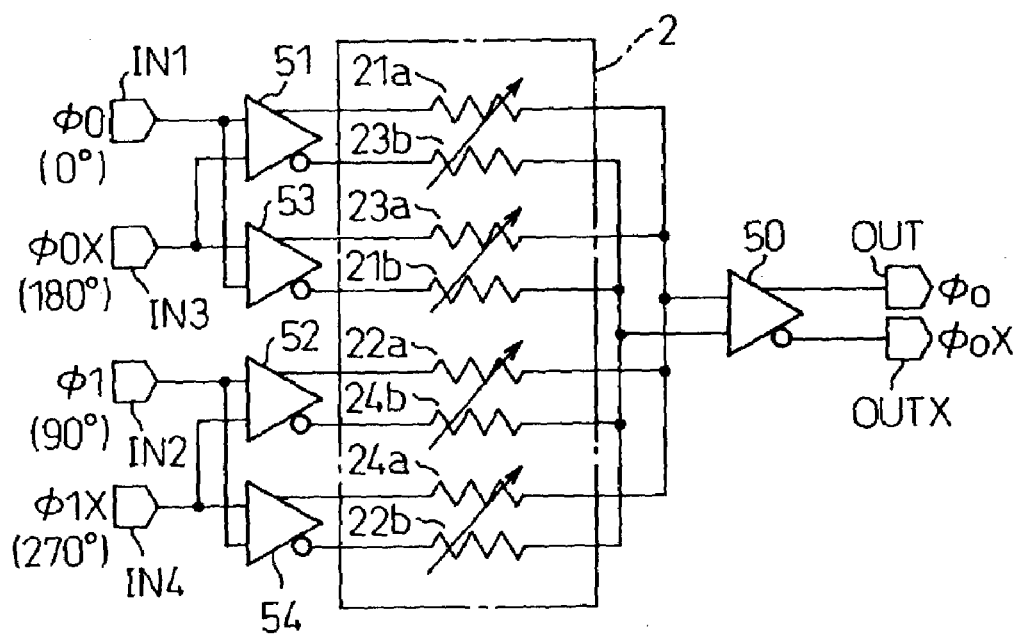
FIG. 17 is a circuit diagram showing a ninth embodiment of the timing signal generating circuit according to the present invention.

FIG. 17 is a circuit diagram showing a ninth embodiment of the timing signal generating circuit according to the present invention.

The timing signal generating circuit of the ninth embodiment uses four-phase clocks φ0, φ0X, φ1, and φ1X that are 90° apart in phase, not the above-described three-phase clocks, as the reference clocks, and in order to enable faster operation, the circuit employs a differential configuration to suppress signal quality degradation.

As shown in FIG. 17, the four-phase clocks φ0, φ1, φ0X, and φ1X are input at four input terminals IN1, IN2, IN3, and IN4, respectively, and the clocks differing in phase by 180° relative to each other are supplied to a first variable impedance group (21a, 22a, 23a, and 24a) and a second variable impedance group (23b, 24b, 21b, and 22b) via respective differential buffers 51, 52, 53, and 54. Here, the first variable impedance group consists of four variable impedance parts 21a, 22a, 23a, and 24a, and the second variable impedance group consists of four variable impedance parts 21b, 22b, 23b, and 24b.

More specifically, in the first variable impedance group, the variable impedance part 21a applies a weight to the 0° clock (φ0) input via the input buffer 51, the variable impedance part 22a applies a weight to the 90° clock (φ1) input via the input buffer 52, the variable impedance part 23a applies a weight to the 180° clock (φ0X) input via the input buffer 53, and the variable impedance part 24a applies a weight to the 270° clock (φ1X) input via the input buffer 54; then, the sum of these weighted signals is output as an output clock φo from the output terminal OUT via the output buffer 50.

Likewise, in the second variable impedance group, the variable impedance part 21b applies a weight to the 0° clock (φ0) input via the input buffer 53, the variable impedance part 22b applies a weight to the 90° clock (φ1) input via the input buffer 54, the variable impedance part 23b applies a weight to the 180° clock (φ0X) input via the input buffer 51, and the variable impedance part 24b applies a weight to the 270° clock (φ1X) input via the input buffer 52; then, the sum of these weighted signals is output as an output clock φoX from the output terminal OUTX via the output buffer 50.

In the above configuration, the impedance part 21a which weights the clock φ0 in the first variable impedance group and the impedance part 23b which weights the clock φ0X in the second variable impedance group, for example, apply the same weight (the same impedance adjustment). That is, the weights applied to the four clocks φ0, φ1, φ0X, and φ1X in the first variable impedance group are respectively the same as the weights applied to the four clocks φ0X, φ1X, φ0, and φ1 in the second variable impedance group (the four clocks in the second variable impedance group are complementary to the four clocks in the first variable impedance group), and therefore, the output clocks φo and φoX are signals similarly adjusted in phase but differing in phase by 180° relative to each other. In this embodiment, any of the variable impedance unit configurations employed in the foregoing embodiments can be applied to the variable impedance parts.

The timing signal generating circuit of the ninth embodiment shown here is configured to take four-phase clocks as inputs, but it will be appreciated that the number of phases can be increased, for example, by using six-phase clocks differing in phase by 60° or eight-phase clocks differing in phase by 45°.

Figure 18:
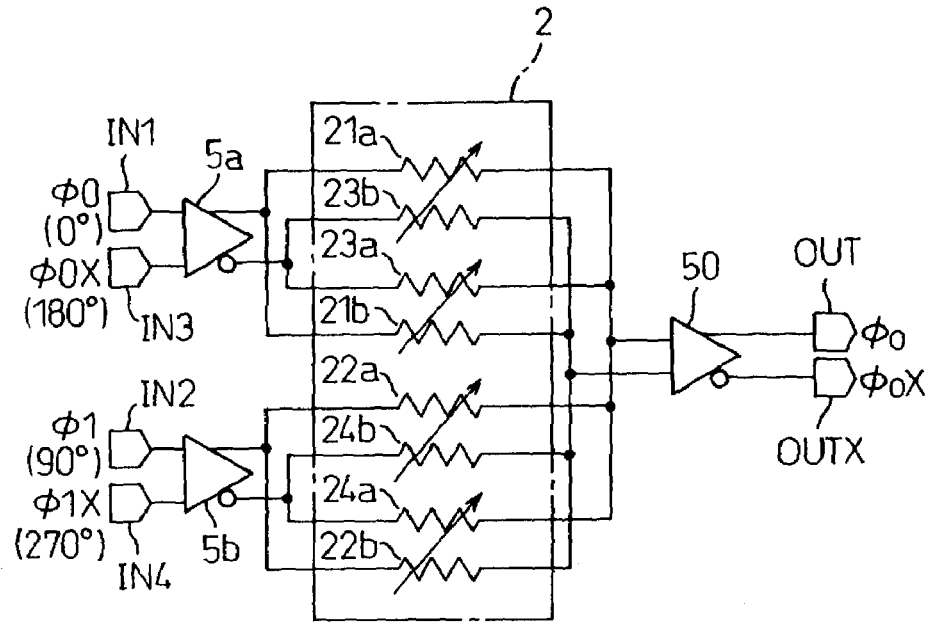
FIG. 18 is a circuit diagram showing a 10th embodiment of the timing signal generating circuit according to the present invention.

FIG. 18 is a circuit diagram showing a 10th embodiment of the timing signal generating circuit according to the present invention.

As is apparent from a comparison between FIG. 18 and FIG. 17, in the timing signal generating circuit of the 10th embodiment, the number of input buffers (differential buffers) is reduced, and one input buffer (5a, 5b) is provided for each of the complementary clock pairs φ0, φ0X and φ1, φ1X.

Figure 19:
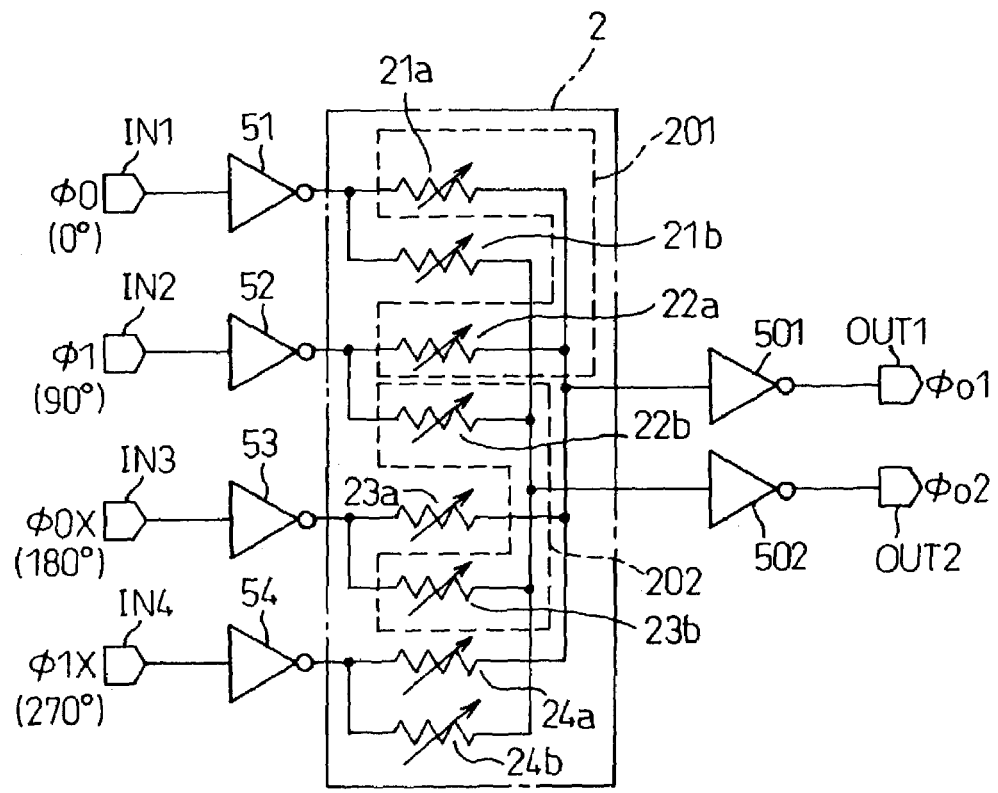
FIG. 19 is a circuit diagram showing an 11th embodiment of the timing signal generating circuit according to the present invention.

FIG. 19 is a circuit diagram showing an 11th embodiment of the timing signal generating circuit according to the present invention.

While the timing signal generating circuits according to the ninth embodiment of FIG. 17 and the 10th embodiment of FIG. 18 are each configured to generate weighted (phase-combined) differential (complementary) output clocks φo and φoX differing in phase by 180°, the 11th embodiment described hereinafter is configured to generate weighted output clocks φo1 and φo2 differing in phase by 90°.

As shown in FIG. 19, the timing signal generating circuit of the 11th embodiment comprises a first variable impedance group connected to a first phase combining terminal (output terminal) OUT1 via an output buffer (inverter) 501, and a second variable impedance group branching off from the input terminals of the first variable impedance group and connected to a second phase combining terminal OUT2 via an output buffer 502. More specifically, the first variable impedance group consists of four variable impedance parts 21a, 22a, 23a, and 24a, and the second variable impedance group consists of four variable impedance parts 21b, 22b, 23b, and 24b. The four-phase clocks φ0, φ1, φ0X, and φ1X input via the respective input terminals IN1, IN2, IN3, and IN4 are supplied to the respective variable impedance parts via the respective input buffers (inverters) 51, 52, 53, and 54.

Here, as shown in FIG. 19, a weight (201) is given, for example, to the variable impedance parts 21a and 22a supplied with the clocks φ0 and φ1, respectively, in the first variable impedance group, and the same weight (202) as the weight (201) is given to the variable impedance parts 22b and 23b supplied with the clock φ1 (a clock having a phase difference of 90° relative to the clock φ0) and φ0X (a clock having a phase difference of 90° relative to the clock φ1), respectively, in the second variable impedance group; then, the respective clocks are combined in phase, and the resulting clocks φo1 and φo2 are output from the output terminals OUT1 and OUT2, respectively. Here, the weight given to the variable impedance parts 23a and 24a supplied with the clocks φ0X and φ1X, respectively, in the first impedance group, and the weight given to the variable impedance parts 24b and 21b supplied with the clock φ1X (a clock having a phase difference of 90° relative to the clock φ0X) and φ0 (a clock having a phase difference of 90° relative to the clock φ1X), respectively, in the second variable impedance group, are also the same. In this way, the output clocks φo1 and φo2 given the same weight and differing in phase by 90° can be generated.

Figure 20:
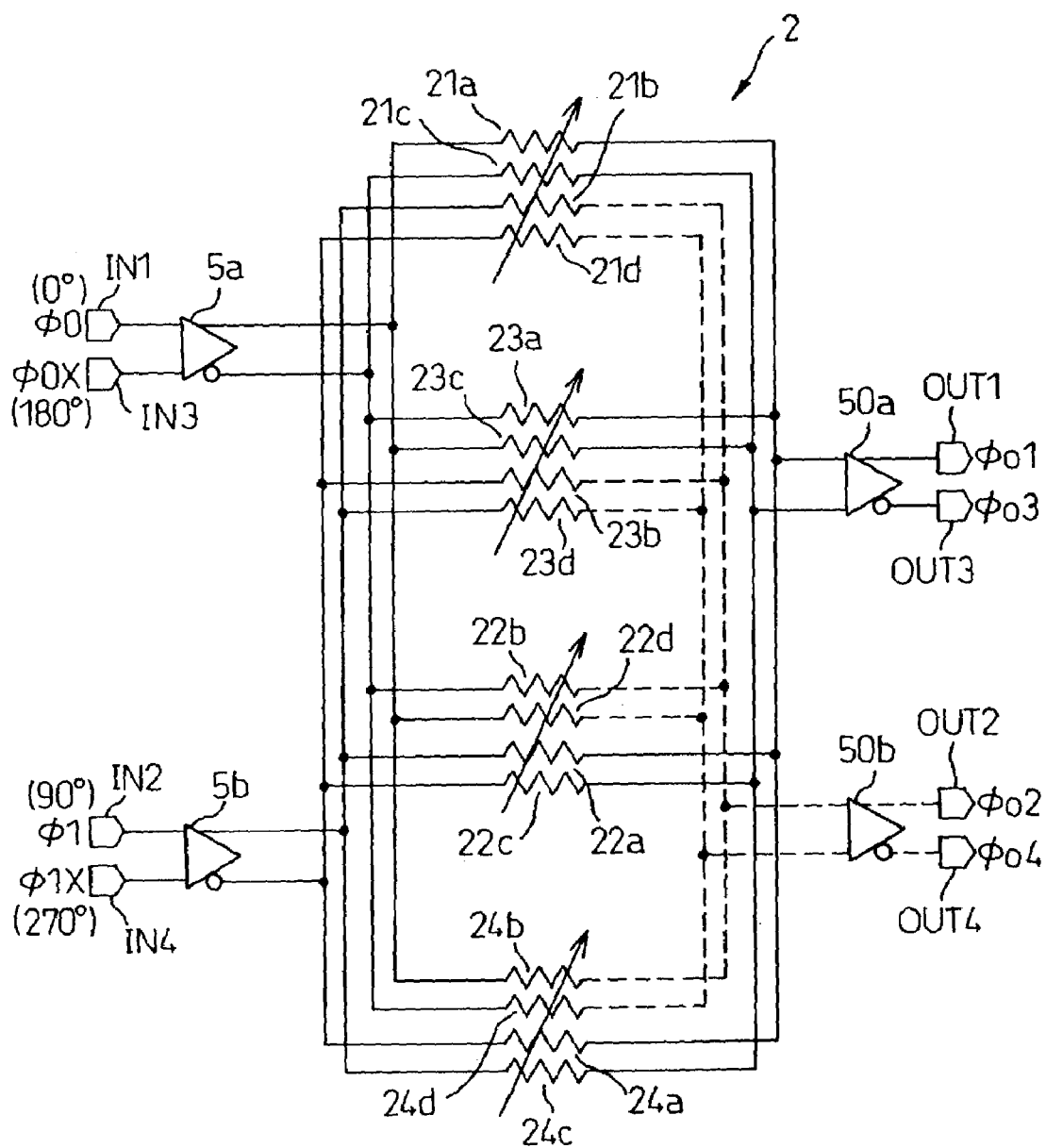
FIG. 20 is a circuit diagram showing a 12th embodiment of the timing signal generating circuit according to the present invention.

FIG. 20 is a circuit diagram showing a 12th embodiment of the timing signal generating circuit according to the present invention. The timing signal generating circuit of the 12th embodiment shown in FIG. 20 is a modification of the above-described 11th embodiment of FIG. 19, and is adapted to produce four-phase output clocks φo1, φo2, φo3, and φo4 by performing control so as to provide the desired phase shift relative to the four-phase input clocks (reference clocks) φ0, φ1, φ0X, and φ1X differing in phase by 90°. The four-phase output clocks φo1, φo2, φo3, and φo4 are spaced 90° apart in phase relative to each other. Here, the first variable impedance group consists of four variable impedance parts 21a, 22a, 23a, and 24a, the second variable impedance group consists of four variable impedance parts 21b, 22b, 23b, and 24b, the third variable impedance group consists of four variable impedance parts 21c, 22c, 23c, and 24c, and the fourth variable impedance group consists of four variable impedance parts 21d, 22d, 23d, and 24d.

More specifically, as shown in FIG. 20, of the four-phase clocks, the 0° and 180° phase clocks (differential clocks) φ0 and φ0X are supplied via an input buffer 5a to the variable impedance parts 21a, 24b, 23c, and 22d and also the variable impedance parts 23a, 22b, 21c, and 24d, while the 90° and 270° phase clocks (differential clocks) φ1 and φ1X are supplied via an input buffer 5b to the variable impedance parts 22a, 21b, 24c, and 23d and also the variable impedance parts 24a, 23b, 22c, and 21d. Here, the variable impedance parts 21a, 21b, 21c, and 21d are given the same weight, and the variable impedance parts 23a, 23b, 23c, and 23d are also given the same weight. Further, the variable impedance parts 22a, 22b, 22c, and 22d are given the same weight, and the variable impedance parts 24a, 24b, 24c, and 24d are also given the same weight.

As the same weight is applied to the input clock pairs differing in phase by 90°, as described above, the output clocks φo1, φo2, φo3, and φo4 are produced as four-phase clocks spaced 90° apart in phase relative to each other and shifted in phase by equal amounts (equivalent to the desired phase shift controlled by weighting) relative to the input clocks (reference clocks φ0, φ1, φ0X, and φ1X). That is, the first to fourth variable impedance groups apply the same weighting to the different combinations of the four-phase input clocks φ0, φ1, φ0X, and φ1X, and produce the output clocks φo1, φo2, φo3, and φo4, the same four-phase clocks as the input clocks.

The timing signal generating circuit of the 12th embodiment shown in FIG. 20 can be adapted, for example, for use as the timing signal generating circuit 103 in the receiver circuit previously shown in FIG. 4, and can be used to generate, for example, the data detection unit control signals CLKd1, CLKd2, CLKd3, and CLKd4 to be supplied to the respective data detection units 111 to 114. If the data detection unit control signals CLKd1, CLKd2, CLKd3, and CLKd4 and the changing point detection unit control signals CLKb1, CLKb2, CLKb3, and CLKb4 are to be generated using the same timing signal generating circuit, eight-phase clocks differing in phase by 45° and first to eight variable impedance groups, for example, should be used.

As described above, according to each embodiment of the present invention, since the timing signal generating circuit can be achieved with simple configuration, power consumption and the area occupied by the circuit can be reduced. Further, in the case of the prior art timing signal generating circuit shown in FIG. 2, for example, it is not only difficult to operate the circuit with a low supply voltage, but it is also difficult to realize a configuration that weights the current values of the current sources for the differential amplifiers; in contrast, in the timing signal generating circuit of each embodiment according to the present invention, a variable impedance weighted-sum configuration is used which can be accomplished by just branching off a variable impedance circuit from an input terminal, and the configuration is therefore extremely easy to realize.

As described in detail above, the timing signal generating circuit (receiver circuit) according to the present invention can operate with a low supply voltage, is simple in configuration, and can generate timing signals with high accuracy.

Many different embodiments of the present invention may be constructed without departing from the spirit and scope of the present invention, and it should be understood that the present invention is not limited to the specific embodiments described in this specification, except as defined in the appended claims.

What is claimed is:

1. A timing signal generating circuit which receives multi-phase input signals via a plurality of input buffers and generates a signal having a phase intermediate therebetween, wherein weighting is applied to said multi-phase input signals by using a variable impedance circuit, each of said input buffers comprising a plurality of stages of electronic elements between a high potential power supply line and a low potential power supply line, said variable impedance circuit comprising a plurality of variable impedance units one for each of said multi-phase input signals, each of said variable impedance units including at least one transistor without providing vertically stacked transistors between the high potential power supply line and the low potential power supply line, and without increasing a number of stages of electronic elements between the high potential power supply line and the low potential power supply line of said input buffers,
   wherein the at least one transistor of each of said variable impedance units includes a first, a second, and a control electrode, said each input signal is received at said first electrode and output at said second electrode, and impedance is controlled by controlling a voltage applied to said control electrode,
   wherein each of said variable impedance units comprises a plurality of variable impedance parts that include said at least one transistor, and wherein said variable impedance parts are arranged to form a plurality of variable impedance groups.

2. The timing signal generating circuit as claimed in claim 1, wherein said multi-phase input signals are clocks of three or more phases.

3. The timing signal generating circuit as claimed in claim 2, wherein said multi-phase input signals are four-phase clocks.

4. The timing signal generating circuit as claimed in claim 1, wherein each of said variable impedance units comprises a plurality of resistive elements and switching elements parallelly connected in pairs, and impedance is controlled by varying the number of switching elements to be turned on, wherein the switching elements include the at least one transistor.

5. The timing signal generating circuit as claimed in claim 1, wherein each of said variable impedance units comprises a plurality of resistive elements and switching elements serially connected in pairs, and impedance is controlled by controlling the number of switching elements to be turned on, wherein the switching elements include the at least one transistor.

6. The timing signal generating circuit as claimed in claim 1, wherein said at least one transistor is a MOS transistor.

7. The timing signal generating circuit as claimed in claim 1, wherein said at least one transistor is a transistor pair consisting of a PMOS transistor and an NMOS transistor connected in parallel.

8. The timing signal generating circuit as claimed in claim 1, further comprising a current-voltage conversion circuit for converting a current control signal into a voltage control signal, and wherein said impedance is controlled by said voltage control signal.

9. The timing signal generating circuit as claimed in claim 1, wherein each of said variable impedance groups applies the same weighting to each of said multi-phase input signals applied thereto.

10. The timing signal generating circuit as claimed in claim 1, further comprising output buffers which are placed at an output stage of said timing signal generating circuit.

11. The timing signal generating circuit as claimed in claim 10, wherein said buffers are differential buffers.

12. A timing signal generating circuit which receives multi-phase input signals via a plurality of input buffers and generates multi-phase output signals, wherein weighting is applied to said multi-phase input signals by using a variable impedance circuit, each of said input buffers comprising a plurality of stages of electronic elements between a high potential power supply line and a low potential power supply line, said variable impedance circuit comprising a plurality of variable impedance units one for each of said multi-phase input signals, each of said variable impedance units including a plurality of variable impedance parts having at least one transistor without providing vertically stacked transistors between the high potential power supply line and the low potential power supply line, and without increasing the number of stages of said electronic elements between the high potential power supply line and the low potential power supply line of said input buffers, wherein said variable impedance parts are arranged to form a plurality of variable impedance groups one for each of said multi-phase input signals and each of said variable impedance groups outputs said multi-phase output signals of the same number of phases as said multi-phase input signals, each of said variable impedance groups applying the same weighting to each of said multi-phase input signals applied thereto.

13. The timing signal generating circuit as claimed in claim 12, wherein said input signals are four-phase clocks, and wherein four variable impedance groups are provided and said variable impedance groups output four-phase signals that are spaced 90° apart in phase as said multi-phase output signals.

14. A timing signal generating circuit which receives multi-phase input signals via a plurality of input buffers and generates a signal having a phase intermediate therebetween,
wherein weighting is applied to said multi-phase input signals by using a variable impedance circuit, each of said input buffers comprising a plurality of stages of electronic elements between a high potential power supply line and a low potential power supply line, said variable impedance circuit comprising a plurality of variable impedance units one for each of said multi-phase input signals, each of said variable impedance units including at least one transistor without providing vertically stacked transistors between the high potential power supply line and the low potential power supply line, and without increasing a number of stages of electronic elements between the high potential power supply line and the low potential power supply line of said input buffers,
wherein the at least one transistor of each of said variable impedance units includes a first, a second, and a control electrode, said each input signal is received at said control electrode and output at said second electrode, and impedance is controlled by controlling a voltage applied to said first electrode,
wherein each of said variable impedance units comprises a plurality of variable impedance parts that include said at least one transistor, and wherein said variable impedance parts are arranged to form a plurality of variable impedance groups.

15. The timing signal generating circuit as claimed in claim 14, wherein said at least one transistor is a MOS transistor.

16. The timing signal generating circuit as claimed in claim 14, wherein said at least one transistor is a transistor pair consisting of a PMOS transistor and an NMOS transistor connected in parallel.

17. The timing signal generating circuit as claimed in claim 14, wherein each of said variable impedance groups applies the same weighting to each of said multi-phase input signals applied thereto.

18. The timing signal generating circuit as claimed in claim 14, further comprising output buffers which are placed at an output stage of said timing signal generating circuit.

19. The timing signal generating circuit as claimed in claim 18, wherein said buffers are differential buffers.

20. A receiver circuit comprising:
a data detection-discrimination circuit for detecting and discriminating data carried in an input signal;
a changing point detection-discrimination circuit for detecting and discriminating a changing point appearing in said input signal;
a phase comparator circuit for receiving outputs from said data detection-discrimination circuit and said changing point detection-discrimination circuit, and for comparing the phases of said outputs; and
a clock signal generating circuit for receiving an output from said phase comparator circuit, wherein
said clock signal generating circuit is a timing signal generating circuit which receives multi-phase input signals via a plurality of input buffers and generates at least one signal having a phase intermediate therebetween, wherein weighting is applied to said multi-phase input signals by using a variable impedance circuit, each of said input buffers comprising a plurality of stages of electronic elements between a high potential power supply line and a low potential power supply line, said variable impedance circuit comprising a plurality of variable impedance units one for each of said multi-phase input signals, each of said variable impedance units including at least one transistor without providing vertically stacked transistors between the high potential power supply line and the low potential power supply line, and without increasing a number of stages of electronic elements between the high potential power supply line and the low potential power supply line of said input buffers,
wherein said at least one transistor of each of said variable impedance units has a first, a second, and a control electrode, said each input signal is received at said first electrode and output at said second electrode, and impedance is controlled by controlling a voltage applied to said control electrode,
wherein each of said variable impedance units comprises a plurality of variable impedance parts, each including said at least one transistor, and wherein said variable impedance parts are arranged to form a plurality of variable impedance groups.

21. The receiver circuit as claimed in claim 20, wherein said multi-phase input signals are clocks of three or more phases.

22. The receiver circuit as claimed in claim 21, wherein said multi-phase input signals are four-phase clocks.

23. The receiver circuit as claimed in claim 20, wherein each of said variable impedance units comprises a plurality of resistive elements and switching elements parallelly connected in pairs, and impedance is controlled by varying the number of switching elements to be turned on, wherein said switching elements include said at least one transistor.

24. The receiver circuit as claimed in claim 20, wherein each of said variable impedance units comprises a plurality of resistive elements and switching elements serially connected in pairs, and impedance is controlled by controlling the number of switching elements to be turned on, wherein said switching elements include said at least one transistor.

25. The receiver circuit as claimed in claim 20, wherein said at least one transistor is a MOS transistor.

26. The receiver circuit as claimed in claim 20, wherein said at least one transistor is a transistor pair consisting of a PMOS transistor and an NMOS transistor connected in parallel.

27. The receiver circuit as claimed in claim 20, wherein said timing signal generating circuit further comprises a current-voltage conversion circuit for converting a current control signal into a voltage control signal, and wherein said impedance is controlled by said voltage control signal.

28. The receiver circuit as claimed in claim 20, wherein each of said variable impedance groups applies the same weighting to each of said multi-phase input signals applied thereto.

29. The receiver circuit as claimed in claim 28, wherein said variable impedance groups are equal in number to said multi-phase input signals, and said variable impedance groups output multi-phase output signals of the same number of phases as said multi-phase input signals, and said at least one signal is comprised of said multi-phase output signals.

30. The receiver circuit as claimed in claim 29, wherein said input signals are four-phase clocks, and wherein four variable impedance groups are provided and said variable impedance groups output four-phase signals that are spaced 90° apart in phase as said multi-phase output signals.

31. The receiver circuit as claimed in claim 20, wherein said timing signal generating circuit further comprises output buffers which are placed at an output stage of said timing signal generating circuit.

32. The receiver circuit as claimed in claim 31, wherein said buffers are differential buffers.

33. The receiver circuit as claimed in claim 20, wherein said clock signal generating circuit generates at least one signal in addition to said at least one signal such that at least two signals are generated and supplies one of said at least two signals as a first internal clock to said data detection-discrimination circuit and another of said at least two signals as a second internal clock to said changing point detection-discrimination circuit.

34. A receiver circuit comprising:
a data detection-discrimination circuit for detecting and discriminating data carried in an input signal;
a changing point detection-discrimination circuit for detecting and discriminating a changing point appearing in said input signal;
a phase comparator circuit for receiving outputs from said data detection-discrimination circuit and said changing point detection-discrimination circuit, and for comparing the phases of said outputs; and
a clock signal generating circuit for receiving an output from said phase comparator circuit, wherein
said clock signal generating circuit is a timing signal generating circuit which receives multi-phase input signals via a plurality of input buffers and generates at least one signal having a phase intermediate therebetween wherein weighting is applied to said multi-phase input signals by using a variable impedance circuit, each of said input buffers comprising a plurality of stages of electronic elements between a high potential power supply line and a low potential power supply line, said variable impedance circuit comprising a plurality of variable impedance units one for each of said multi-phase input signals, each of said variable impedance units including at least one transistor without providing vertically stacked transistors between the high potential power supply line and the low potential power supply line, and without increasing a number of stages of electronic elements between the high potential power supply line and the low potential power supply line of said input buffers,
wherein said at least one transistor of each of said variable impedance units has a first, a second, and a control electrode, said each input signal is received at said control electrode and output at said second electrode, and impedance is controlled by controlling a voltage applied to said first electrode,
wherein each of said variable impedance units comprises a plurality of variable impedance parts, each including said at least one transistor, and wherein said variable impedance parts are arranged to form a plurality of variable impedance groups.

35. The receiver circuit as claimed in claim 34, wherein said at least one transistor is a MOS transistor.

36. The receiver circuit as claimed in claim 34, wherein said at least one transistor is a transistor pair consisting of a PMOS transistor and an NMOS transistor connected in parallel.

37. The receiver circuit as claimed in claim 34, wherein each of said variable impedance groups applies the same weighting to each of said multi-phase input signals applied thereto.

38. The receiver circuit as claimed in claim 37, wherein said variable impedance groups are equal in number to said multi-phase input signals, and said variable impedance groups output multi-phase output signals of the same number of phases as said multi-phase input signals received via said input buffers, and said at least one signal is comprised of said multi-phase output signals.

39. The receiver circuit as claimed in claim 38, wherein said input signals are four-phase clocks, and wherein four variable impedance groups are provided and said variable impedance groups output four-phase signals that are spaced 90° apart in phase as said multi-phase output signals.

40. The receiver circuit as claimed in claim 34, wherein said timing signal generating circuit further comprises output buffers which are placed at an output stage of said timing signal generating circuit.

41. The receiver circuit as claimed in claim 40, wherein said buffers are differential buffers.

* * * * *